United States Patent
Mouri

(10) Patent No.: US 6,445,441 B1
(45) Date of Patent: Sep. 3, 2002

(54) EXPOSURE APPARATUS, SEMICONDUCTOR MANUFACTURING APPARATUS, AND SEMICONDUCTOR MANUFACTURING METHOD

(75) Inventor: Takashi Mouri, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/563,322

(22) Filed: May 3, 2000

(30) Foreign Application Priority Data

May 10, 1999 (JP) .......................................... 11-128338

(51) Int. Cl.⁷ .......................... G03B 27/42; G03B 27/62
(52) U.S. Cl. ............................ 355/53; 355/30; 355/75; 414/935; 438/14
(58) Field of Search .................... 396/611; 414/222.13, 414/273, 935, 937, 938, 939, 940, 941; 700/127; 438/14; 716/19; 430/5, 22, 30; 355/53, 75

(56) References Cited

U.S. PATENT DOCUMENTS

| | | | | |
|---|---|---|---|---|
| 5,100,276 A | * | 3/1992 | Iwasaki et al. .............. | 414/222 |
| 5,442,163 A | * | 8/1995 | Nakahara et al. ........... | 235/375 |
| 5,668,733 A | * | 9/1997 | Morimoto et al. ........... | 716/19 |
| 5,867,389 A | * | 2/1999 | Hamada et al. ............. | 700/121 |
| 5,909,030 A | * | 6/1999 | Yoshitake et al. ............ | 355/63 |
| 6,184,970 B1 | * | 2/2001 | Nakahara et al. ............. | 355/53 |
| 6,185,474 B1 | * | 2/2001 | Nakamura et al. .......... | 700/121 |
| 6,275,744 B1 | * | 8/2001 | Yoshida ...................... | 414/937 |
| 6,337,162 B1 | * | 1/2002 | Irie .............................. | 430/5 |

FOREIGN PATENT DOCUMENTS

| | | |
|---|---|---|
| JP | 5-055103 | 3/1993 |
| JP | 10-098086 | 4/1998 |

* cited by examiner

*Primary Examiner*—Alan A. Mathews
(74) *Attorney, Agent, or Firm*—Fitzpatrick, Cella, Harper & Scinto

(57) ABSTRACT

An exposure apparatus for performing exposure processing for a plurality of substrates in accordance with a plurality of jobs, including a first job and a second job to be performed subsequent to the first job, each of the jobs having predetermined operations and exposure parameters necessary for the exposure processing set in advance. The apparatus includes a switching device for switching from the first job to the second job during or after a period of exposure by a final shot of a final substrate of the plurality of substrates, to be exposed in accordance with the first job, and before the exposed final substrate is unloaded from a position at which the final substrate is exposed.

27 Claims, 6 Drawing Sheets

SEMICONDUCTOR DEVICE MANUFACTURING FLOW

EXPOSURE APPARATUS, SEMICONDUCTOR MANUFACTURING APPARATUS, AND SEMICONDUCTOR MANUFACTURING METHOD

FIELD OF THE INVENTION

The present invention relates to a semiconductor manufacturing apparatus and semiconductor manufacturing method for manufacturing semiconductor devices such as an LSI and VLSI, and an exposure apparatus preferably used in such apparatus and method.

BACKGROUND OF THE INVENTION

Conventionally, semiconductor exposure apparatuses for exposing wafers are popular in a process of manufacturing semiconductor devices such as an LSI and VLSI.

In the process of manufacturing these semiconductor devices, operations of a plurality of semiconductor exposure apparatuses used in the lithography step are generally managed by a host computer or personal computer for integrally controlling these exposure apparatuses in order to rapidly perform manufacturing processing (work processing) for a plurality of semiconductor devices in units of so-called lots with high efficiency and improve the production efficiency of the whole production line.

In executing processing for a given lot, the host computer or personal computer used in integral control generally selects, from a database storing operation parameters, a work unit (to be referred to as a job hereinafter) including predetermined operations necessary for the processing that are set (programmed) in advance. Then, the computer instructs an exposure apparatus to be controlled to start exposure processing.

In a recent semiconductor device manufacturing, plant, the availability of each of exposure apparatuses arranged in the semiconductor manufacturing plant is increased by integral control by a host computer or personal computer. At the same time, all the manufacturing steps are automated including coating units arranged for the pre-step and post-step of the exposure apparatus to supply predetermined agents, and a developing unit for developing an exposed substrate (wafer in an embodiment of the present invention), or a hybrid unit (to be referred to as a coating/developing unit hereinafter) capable of executing these steps by a single device. A series of manufacturing steps tend to be integrated into an in-line process in an unmanned clean room (i.e., a manufacturing line for automatically executing these manufacturing steps tends to be constructed).

In this automated manufacturing line, one lot as one manufacturing unit is often processed as one carrier including a plurality of (e.g., 25) wafers. In general, semiconductors to be manufactured for various types of products each in a small quantity require different jobs or reticles to be executed or used every lot.

To automate the semiconductor device manufacturing process, increase the availability of each exposure apparatus, and process wafers with high efficiency under these circumstances, switching processing between a given lot and the next lot must be rapidly done.

In switching processing between lots in a conventional exposure apparatus, the job or reticle is switched to one to be executed or used for the next lot after the previous lot is processed, and the final wafer included in the lot is unloaded. This switching processing is performed by transferring a job (job data) selected from a database by a device such as an integral control computer to an exposure apparatus to be controlled, and loading a reticle to be used for the next lot to a reticle stage.

However, the conventional switching processing suffers the following problem.

More specifically, when a job for a previous lot is different from that for the next job, the job and reticle can only be switched to ones for the next lot after the final wafer included in the previous lot is unloaded, and the exposure apparatus shifts to a standby state for the next lot. The time required to switch the job for a given lot to that for the next lot decreases the availability of each exposure apparatus. This fails to increase the manufacturing efficiency of the whole manufacturing line.

SUMMARY OF THE INVENTION

The present invention has been made to overcome the conventional drawbacks, and has as its object to shorten the switching time between lots in the manufacturing process of successively processing lots using different jobs or original plates, and increases the availability of an exposure apparatus or the efficiency of the exposure step in an exposure apparatus, semiconductor manufacturing apparatus, and semiconductor manufacturing method.

To achieve the above object, according to the present invention, an exposure apparatus for performing exposure processing for a plurality of substrates (e.g., semiconductor wafers) in accordance with a predetermined job corresponding to a lot constituted by the substrates to be exposed comprises switching means for switching the job to a job corresponding to a lot to be processed next while a final substrate is unloaded after the final substrate included in the lot in process is exposed by a final shot.

A semiconductor manufacturing apparatus according to the present invention comprises this exposure apparatus.

According to the present invention, a semiconductor manufacturing method of controlling an exposure mechanism using a controller to perform exposure processing for a plurality of substrates in accordance with a predetermined job corresponding to a lot constituted by the substrates to be exposed, and manufacturing semiconductor devices from the exposed substrates comprises switching, by the controller, the job to a job corresponding to a lot to be processed next while a final substrate is unloaded after the final substrate included in the lot in process is exposed by a final shot.

When lots using different jobs or original plates (e.g., exposure patterns) are successively processed in the arrangement of the present invention, the job or original plate is switched to one to be used in the next lot before the completion of unloading the final substrate after the final substrate included in a lot in process is exposed by the final shot.

According to the present invention, the time from the completion of exposing the final substrate to the completion of unloading is shortened, compared to a conventional apparatus which can only switch a job or original plate after the final substrate is unloaded.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENT

A preferred embodiment of the present invention will be described in detail below with reference to the accompanying drawings.

In the preferred embodiment of the present invention, when an exposure apparatus according to the present invention is connected in line to a coating unit for supplying a predetermined agent and a developing unit for developing an exposed substrate (wafer in this embodiment), or a coating/developing unit capable of executing these steps by a single device, a wafer is unloaded from the exposure apparatus to the developing unit concerning the post-step (downstream step).

When the exposure apparatus according to the present invention is used as a stand-alone apparatus, a wafer is unloaded to a predetermined carrier (transport device).

A job or original plate (reticle) is switched in accordance with an instruction from the console of the exposure apparatus or a controller such as a host computer or personal computer connected to the exposure apparatus. The job is switched to one for a lot to be processed next by loading the job from the host computer or personal computer to the exposure apparatus.

In this embodiment, the controller of the exposure apparatus determines the end of processing for the final wafer included in a previous lot in order to switch the job and reticle to ones for the next lot before the final wafer of the previous lot is unloaded. In parallel with an unloading operation of the final wafer, the controller loads a job to be executed for the next lot, and loads a reticle to be used for the next lot to a reticle stage. This eliminates wasteful time in switching between lots when lots using different jobs and reticles are successively processed. The actual availability of the exposure apparatus can be increased.

Figure 1:
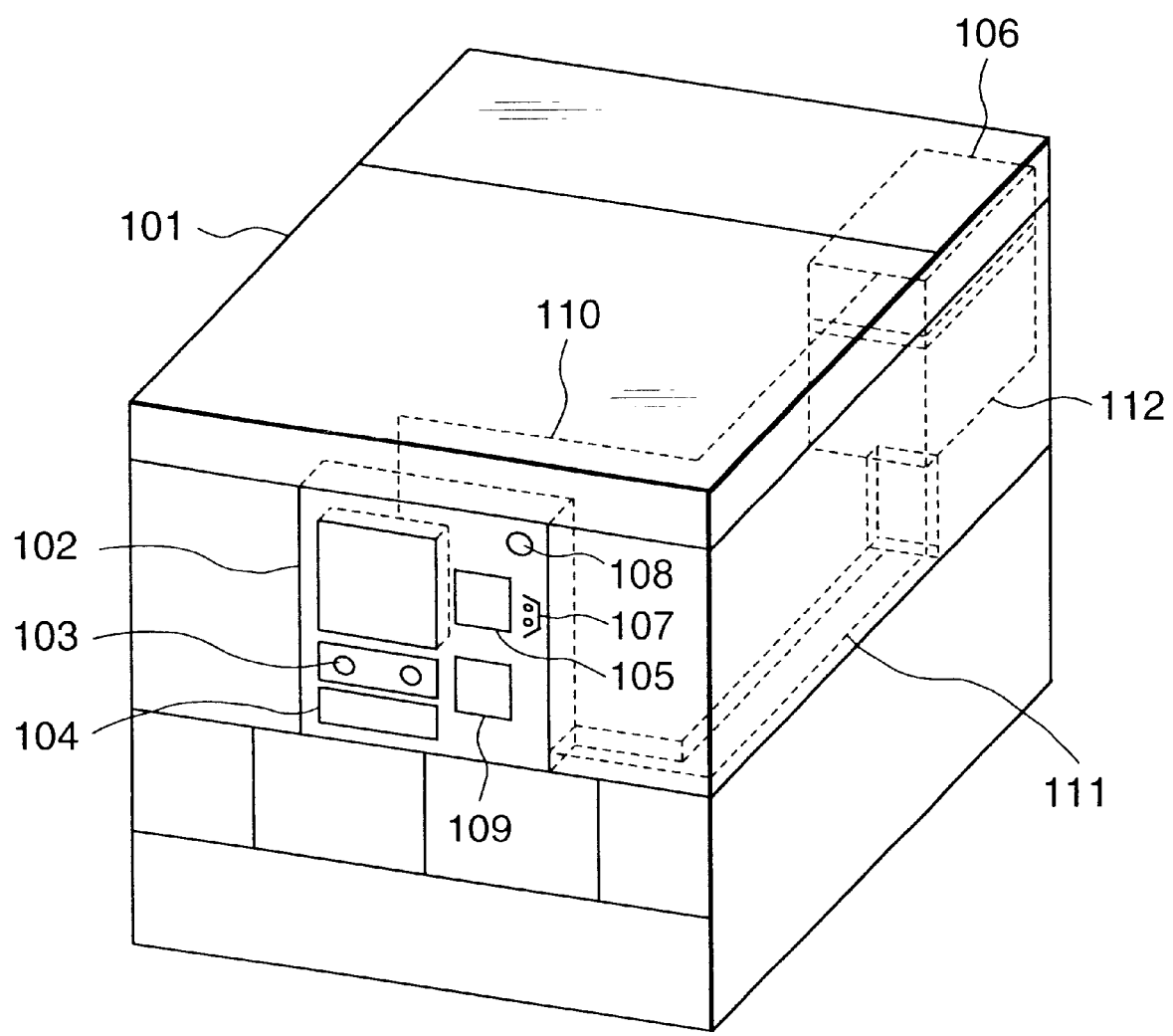
FIG. 1 is a perspective view showing the outer appearance of a semiconductor exposure apparatus according to an embodiment of the present invention.

FIG. 1 is a perspective view showing the outer appearance of a semiconductor exposure apparatus according to the embodiment of the present invention. As shown in FIG. 1, this semiconductor exposure apparatus comprises an EWS (Engineering Work Station) main body 106 having a CPU for controlling the apparatus main body, and a console including an EWS display 102 for displaying predetermined information in the apparatus, a monitor display 105 for displaying image information obtained via an image sensing means in the apparatus main body, an operation panel 103 for supplying a predetermined input to the apparatus, and an EWS keyboard 104.

In FIG. 1, reference numeral 107 denotes an ON-OFF switch; 108, an emergency stop switch; 109, various switches, mouse, and the like; 110, a LAN communication cable; 111, an exhaust duct for heat generated from a console function; and 112, an exhaust device for a chamber.

The main body of the semiconductor exposure apparatus is incorporated in a chamber 101. The EWS display 102 is a flat EL, plasma, or liquid crystal display. The EWS display 102 is attached to the front surface of the chamber 101, and connected to the EWS main body 106 via the LAN cable 110. The operation panel 103, keyboard 104, monitor display 105, and the like are also attached to the front surface of the chamber 101 so as to enable the same console operation as the conventional one from the front surface of the chamber 101.

Figure 2:
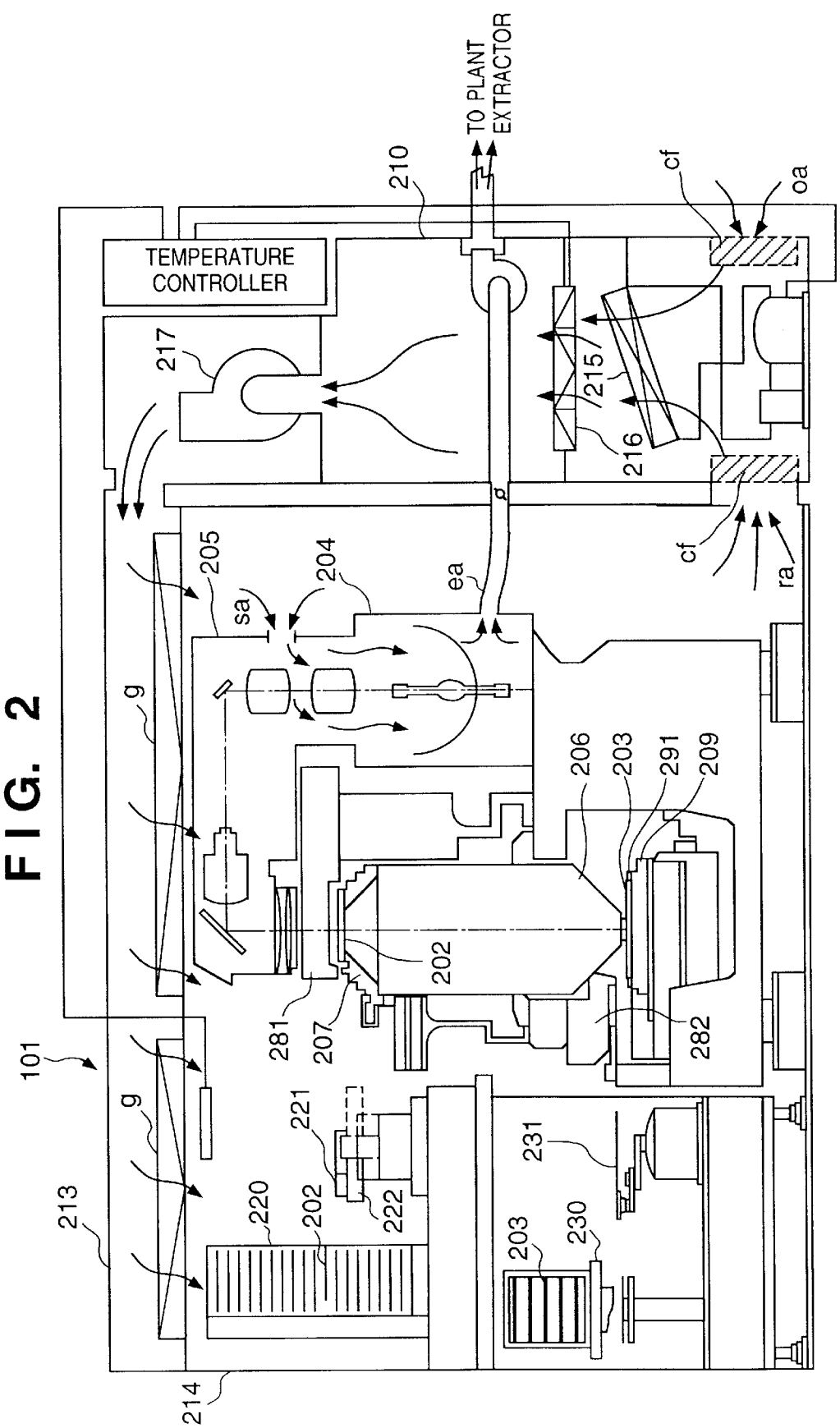
FIG. 2 is a sectional view showing the internal structure of the apparatus in FIG. 1.

FIG. 2 is a sectional view showing the internal structure of the apparatus in FIG. 1. FIG. 2 shows a stepper as a semiconductor exposure apparatus.

In FIG. 2, reference numeral 202 denotes a reticle; and 203, a wafer. When a light beam emitted by a light source 204 passes through an illumination optical system 205 to illuminate the reticle 202, a predetermined exposure pattern on the reticle 202 can be transferred to a photosensitive layer on the wafer 203 via a projection lens 206.

The reticle 202 is supported by a reticle stage 207 for holding and moving the reticle 202. The wafer 203 is exposed while being vacuum-chucked by a wafer chuck 291. The wafer chuck 291 is movable along respective axes by a wafer stage 209.

A reticle optical system 281 for detecting the positional shift amount of the reticle is arranged above the reticle 202. An off-axis microscope 282 is arranged above the wafer stage 209 so as to be adjacent to the projection lens 206. The off-axis microscope 282 mainly detects the relative positions of its internal reference mark and an alignment mark on the wafer 203.

A reticle library 220 and wafer carrier elevator 230 as peripheral equipment are adjacent to the stepper main body. A necessary reticle and wafer are transferred to the main body by a reticle transfer device 221 and wafer transfer device 231, respectively. In transferring a reticle by the reticle transfer device 221 to the reticle library 220 or main body, a reticle cassette bar code reader 222 reads a bar code on a reticle cassette.

The upper portion of the chamber 101 is constituted by an air conditioner 210 for adjusting the air temperature, a filter box 213 for filtering small foreign matter and forming a uniform flow of clean air, and a booth 214 for shielding the apparatus environment from the outside. In the chamber 101, air temperature-adjusted by a cooler 215 and a re-heater 216 in the air conditioner 210 is supplied to the booth 214 via an air filter g by a blower 217. The air supplied to the booth 214 is taken again in the air conditioner 210 via a return port ra, and circulated in the chamber 101.

In general, the chamber 101 is not strictly a perfect circulating system, and introduces air outside the booth 214 by about 10% of the circulating air amount via an outside air inlet port oa formed in the air conditioner 210 in order to always maintain the interior of the booth 214 at a positive pressure. In this manner, the chamber 101 can keep the ambient temperature of the apparatus constant, and keep the air clean.

The light source 204 has an intake port sa and exhaust port ea for cooling by an extra-high-pressure mercury-vapor lamp or generation of a toxic gas upon a laser abnormality. Part of the air in the booth 214 is flowed through the light source 204, and forcibly exhausted to plant facilities via a dedicated exhaust fan attached to the air conditioner 210. Chemisorption filters cf for removing a chemical substance in the air are attached to the outer-air inlet port oa and return port ra of the air conditioner 210.

Figure 3:
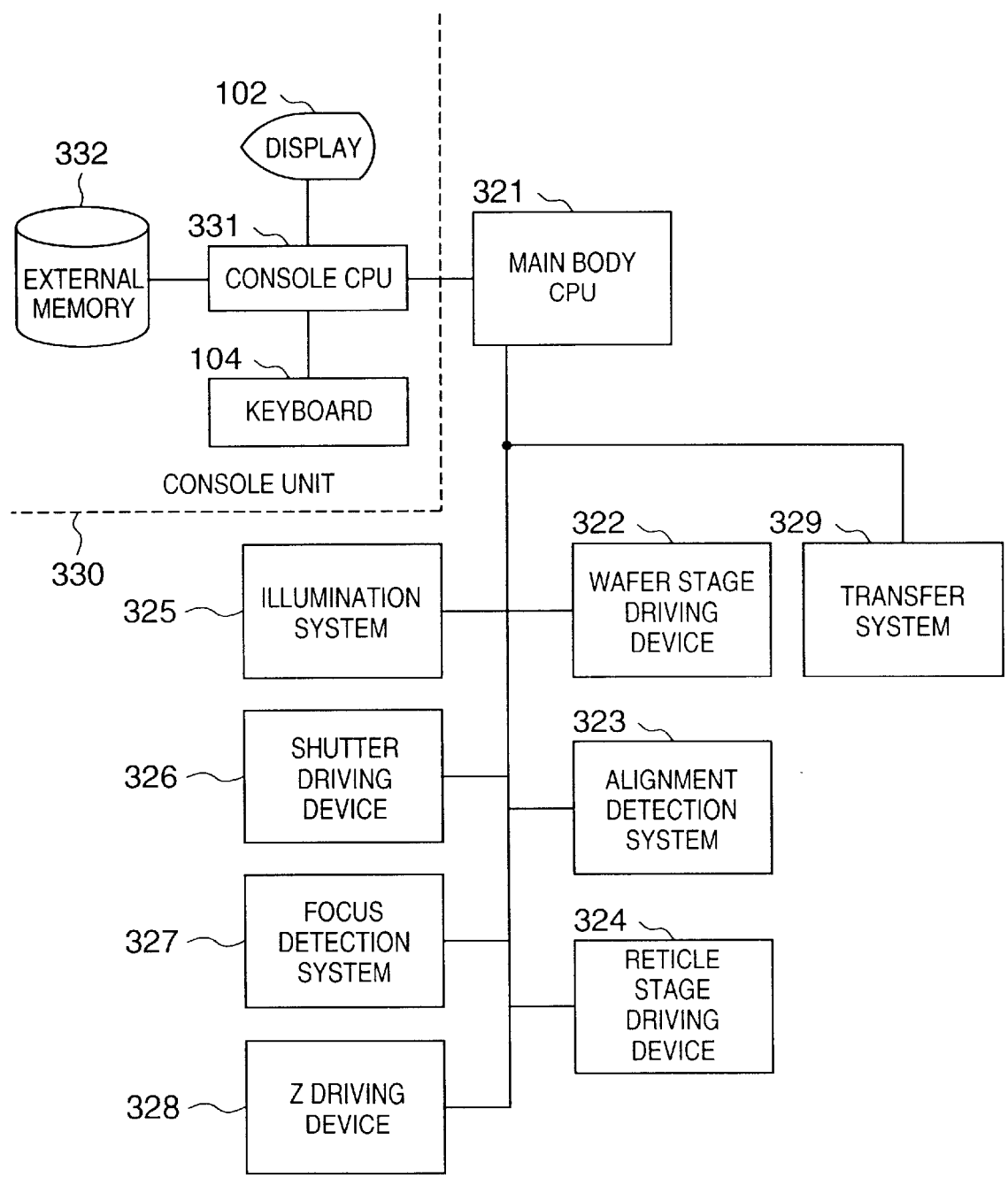
FIG. 3 is a block diagram showing the electrical circuit arrangement of the apparatus in FIG. 1.

FIG. 3 is a block diagram showing the electrical circuit arrangement of the apparatus in FIG. 1.

In FIG. 3, reference numeral 321 denotes a main body CPU incorporated in the EWS main body 106 to control the whole apparatus. The main body CPU 321 is formed from a central processing unit such as a microcomputer or minicomputer.

Reference numeral 322 denotes a wafer stage driving device; 323, an alignment detection system such as the off-axis microscope 282; 324, a reticle stage driving device; 325, an illumination system such as the light source 204; 326, a shutter driving device; 327, a focus detection system; and 328, a Z driving device. These devices are controlled by the main body CPU 321. Reference numeral 329 denotes a transfer system such as the reticle transfer unit 221 and wafer transfer device 231; and 330, a console unit having the display 102, keyboard 104, and the like. The console unit 330 supplies various commands and parameters concerning the operation of the exposure apparatus to the main body CPU 321. That is, the console unit 330 allows exchanging information between the main body CPU 321 and the operator. Reference numeral 331 denotes a console CPU; and 332, an external memory for storing parameters and the like.

Figure 4:
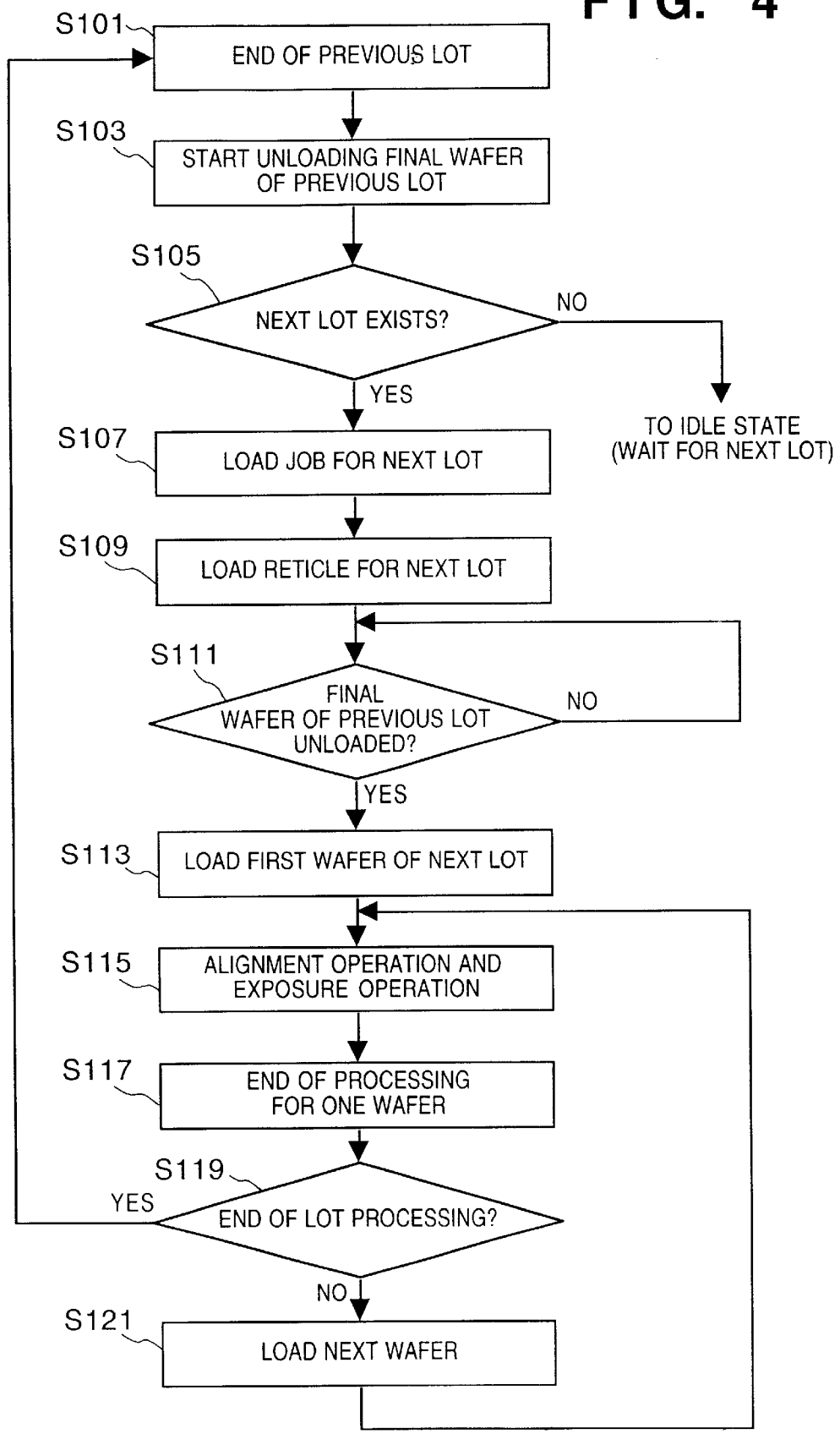
FIG. 4 is a flow chart showing job switching/reticle loading processing before the final wafer is unloaded in the apparatus in FIG. 1.

Job switching/reticle loading processing before the final wafer is unloaded from the above-described apparatus will be explained with reference to FIG. 4.

If lot processing starts by operating a start button (not shown) on the display (and touch panel) 102 or issuing a start instruction from a host computer or personal computer, and the final wafer for lot processing is exposed by the final shot (step S101), the flow advances to step S103 to instruct the start of unloading the final wafer in the lot (previous lot) from the wafer stage 209. Then, the flow advances to step S105 before the completion of unloading.

In step S103, the start of unloading the final wafer may be informed to the host computer for integrally controlling the whole manufacturing line.

In step S105, whether a next lot exists is confirmed. If Yes in step S105, the flow advances to step S107. If No in step S105, the flow waits for the completion (step S111) of unloading the final wafer included in the previous lot, and shifts the apparatus to an idle state (standby state for a next lot).

In step S107, while the final wafer is unloaded, a job to be executed for the next lot is loaded from the external memory 332 and transferred to the main body CPU 321. In general, job loading processing is automatically done by the console of the exposure apparatus. Alternatively, this processing may start upon reception of an instruction from the host computer for integrally controlling the whole manufacturing line.

Job loading processing in step S107 can be prepared before an exposure operation of the final wafer of the previous lot is completed. The operation of preparing job loading processing in advance is described in detail in, e.g., Japanese Patent Laid-Open No. 5-55103.

In step S109, a reticle to be used for the next lot is loaded onto the reticle stage 207 of the exposure apparatus in parallel with an unloading operation of the final wafer.

In this reticle loading operation, a reticle to be used can be transferred to a reticle standby position (not shown) in advance. This preparation operation is also described in detail in, e.g., Japanese Patent Laid-Open No. 5-55103.

In step S111, the flow waits for the completion of unloading the final wafer. The completion of the unloading operation means that when the exposure apparatus is connected in line to the coating/developing unit, the final wafer is transferred to the developing unit, or that when the exposure apparatus is of a stand-alone type, the wafer 203 stores the final wafer and can be removed.

In step S111, if the completion of the unloading operation is determined, the completion of unloading the final wafer may be informed to the host computer or personal computer.

After the final wafer is unloaded, the first wafer of the next lot is loaded onto the wafer stage 209 in step S113. In S115, alignment operation and exposure operation are executed to start processing for the next lot.

When the exposure apparatus is connected in line to the coating/developing unit, a loading operation of the first wafer in step S113 may be done before an exposure operation of the final wafer of the previous lot is completed. This previous loading operation of the first wafer is disclosed in detail in, e.g., Japanese Patent Laid-Open No. 10-98086.

After one wafer is exposed in step S117, the flow advances to step S119 to check whether the processed wafer is the final wafer of the lot. If Yes in step S119 (end of lot processing), the flow returns to step S101 to set the exposure apparatus to a previous-lot end state. If No in step S119, the flow advances to step S121 to wait for loading of the next wafer.

After the next wafer is loaded, the flow returns to step S115 to execute alignment operation and exposure operation. This processing is repeated until the final wafer of the lot is processed.

As described above, according to the embodiment, the job and reticle are switched to ones to be executed and used for the next lot before the completion of unloading the final wafer included in the previous lot. This can eliminate a wasteful time in switching lots.

<Device Manufacturing Method>

A semiconductor device manufacturing method using the above exposure apparatus will be explained.

Figure 5:
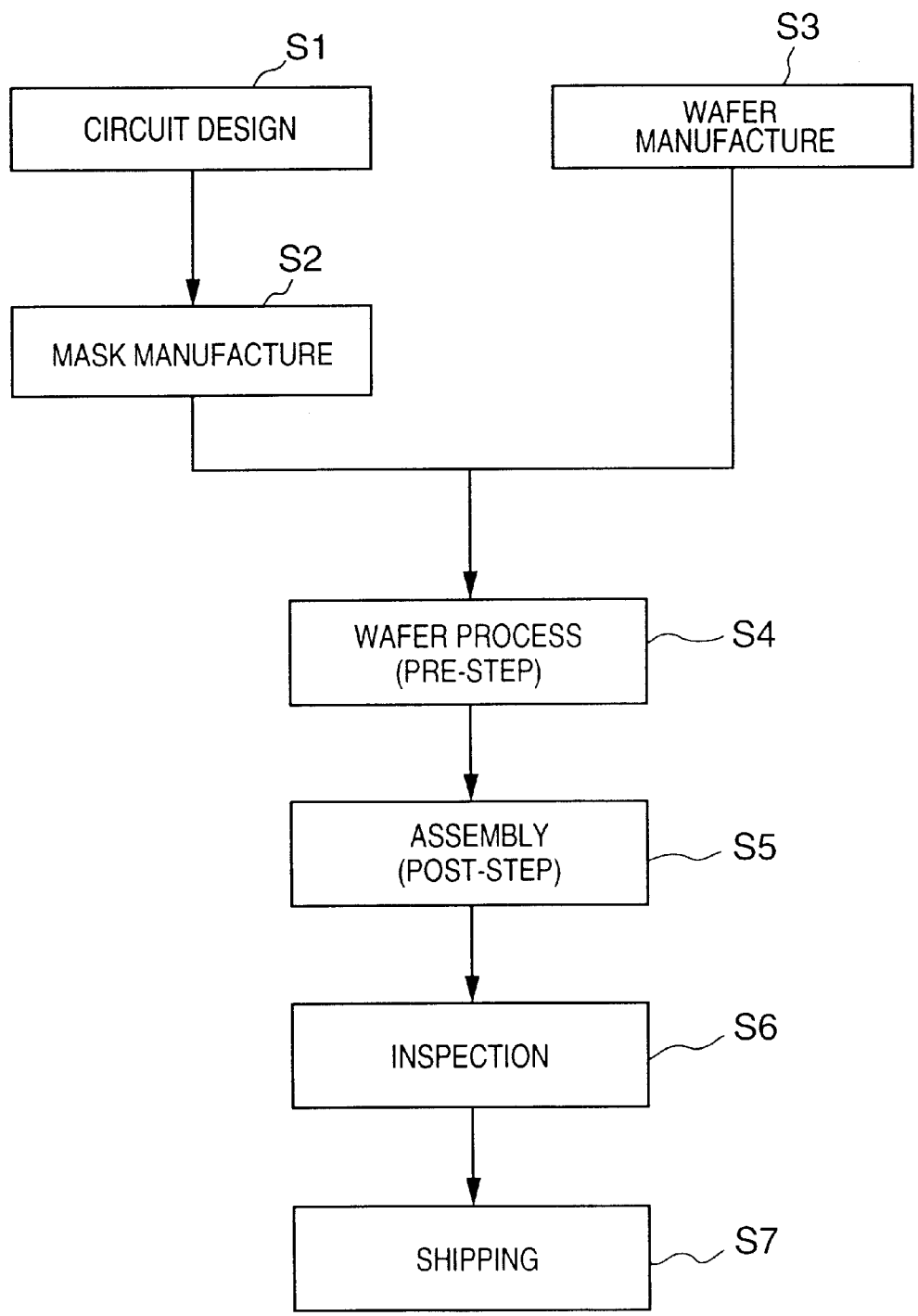
FIG. 5 is a flow chart showing a device manufacturing method which can use the exposure apparatus of the present invention.

FIG. 5 shows the flow of manufacturing a microdevice (semiconductor chip such as an IC or LSI, liquid crystal panel, CCD, thin-film magnetic head, micromachine, or the like).

In step 1 (circuit design), a device pattern is designed. In step 2 (mask manufacture), a mask having the designed pattern is manufactured. In step 3 (wafer manufacture), a wafer is manufactured using a material such as silicon or glass. In step 4 (wafer process) called the pre-step, an actual circuit is formed on the wafer by lithography using the prepared mask and wafer.

Step 5 (assembly) called the post-step is the step of forming a semiconductor chip using the wafer formed in step 4, and includes the assembly step (dicing and bonding) and the packaging step (chip encapsulation).

The semiconductor device is completed through these steps, and shipped (step 7).

Figure 6:
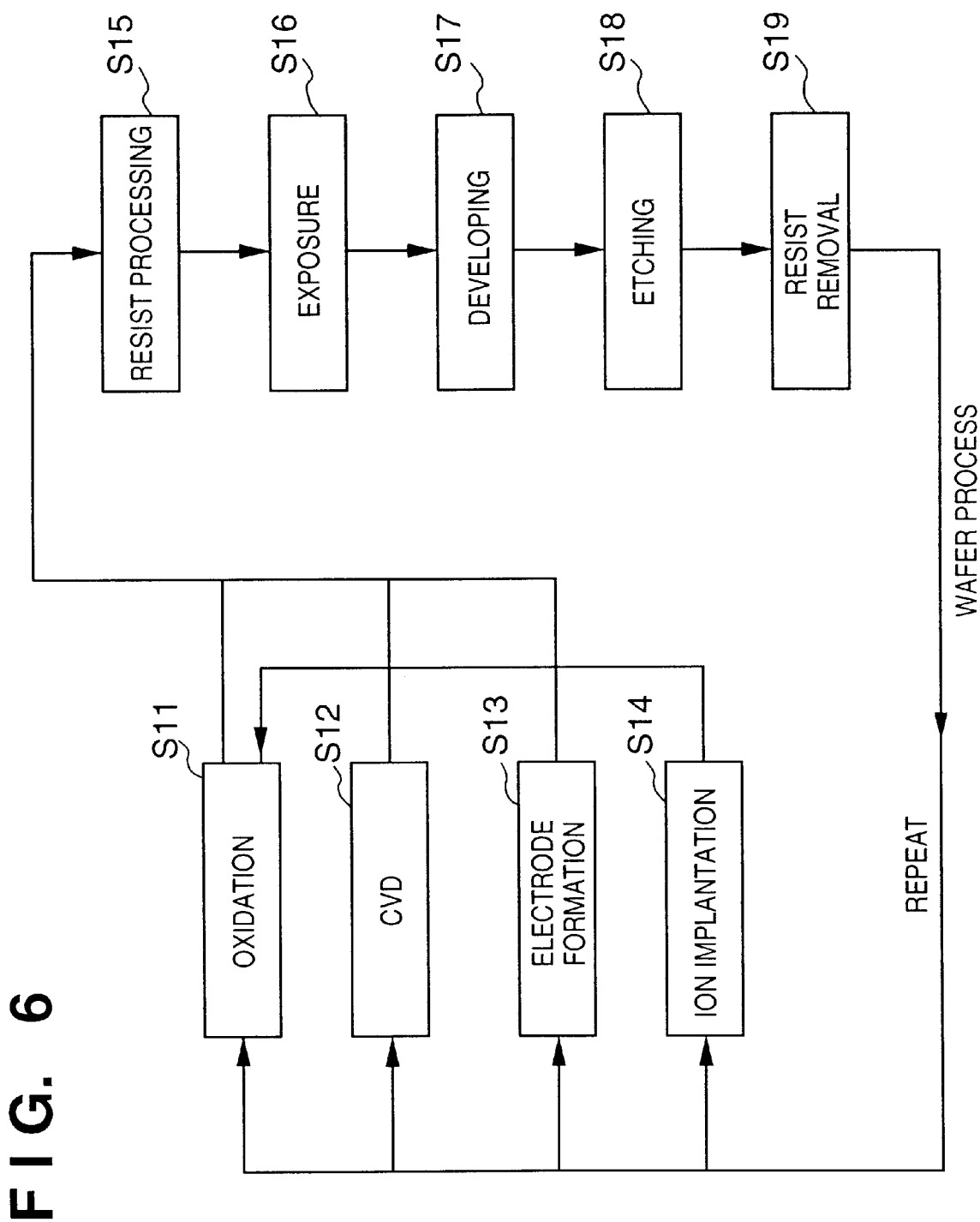
FIG. 6 is a flow chart showing the wafer process in FIG. 5 in detail.

FIG. 6 shows a detailed flow of the wafer process (step 4). In step 11 (oxidation), the wafer surface is oxidized. In step 12 (CVD), an insulating film is formed on the wafer surface. In step 13 (electrode formation), an electrode is formed on the wafer by deposition.

In step 14 (ion implantation), ions are implanted into the wafer. In step 15 (resist processing), a resist is applied to the wafer. In step 16 (exposure), the circuit pattern of the mask is arranged in a plurality of shot regions of the wafer to expose the wafer using the above-described exposure apparatus or exposure method.

In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The manufacturing method of this embodiment can manufacture at low cost a large-size device, which is difficult to manufacture in the prior art.

As has been described above, when lots using different jobs or original plates are successively processed, this embodiment can shorten the switching time of jobs or original plates between lots. Accordingly, the actual availability of the exposure apparatus can increase.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for performing exposure processing for a plurality of substrates in accordance with a plurality of jobs, including a first job and a second job to be performed subsequent to the first job, each of the jobs having predetermined operations and exposure parameters necessary for the exposure processing set in advance, said apparatus comprising:

switching means for switching from the first job to the second job during or after a period of exposure by a final shot of a final substrate of the plurality of substrates, to be exposed in accordance with the first job, and before the exposed final substrate is unloaded from a position at which the final substrate is exposed.

2. The apparatus according to claim 1, wherein the exposed substrate is unloaded to a developing unit connected in line or to a predetermined transfer device.

3. The apparatus according to claim 1, wherein said switching means performs the switching operation in accordance with an instruction from a console of the exposure apparatus or an external controller connected to the exposure apparatus.

4. A semiconductor manufacturing apparatus comprising the exposure apparatus defined in claim 1 as exposure means.

5. An exposure apparatus for performing exposure processing for a plurality of substrates using original plates, including a first original plate and a second original plate to be used next to the first original plate, each of the original plates having a pattern to be used for exposing the plurality of substrates, said apparatus comprising:

switching means for switching from the first original plate to the second original plate during or after a period of exposure of a final shot of a final substrate of the plurality of substrates, to be exposed by using the first original plate, and before the exposed final substrate is unloaded from a position at which the final substrate is exposed.

6. The apparatus according to claim 5, wherein the exposed substrate is unloaded to a developing unit connected in line or to a predetermined transfer device.

7. The apparatus according to claim 5, wherein said switching means performs the switching operation in accordance with an instruction from a console of the exposure apparatus or an external controller connected to the exposure apparatus.

8. A semiconductor manufacturing apparatus comprising the exposure apparatus defined in claim 5 as exposure means.

9. An exposure apparatus for performing exposure processing for a plurality of substrates in accordance with a plurality of jobs, including a first job and a second job to be performed subsequent to the first job, each of the jobs having predetermined operations and exposure parameters necessary for the exposure processing set in advance, using original plates, which include a first original plate and a second original plate to be used next to the first original plate, each of the original plates having a pattern to be used for exposing the plurality of substrates, said apparatus comprising:

job switching means for switching from the first job to the second job during or after a period of exposure of a final shot of a final substrate of the plurality of substrates, to be exposed in accordance with the first job, and before the exposed final substrate is unloaded from a position at which the final substrate is exposed; and original plate switching means for switching from the first original plate to the second original plate during or after a period of exposure of a final shot of the final substrate to be exposed, by using the first original plate, and before the exposed final substrate is unloaded from the position at which the final substrate is exposed.

10. The apparatus according to claim 9, wherein the exposed substrate is unloaded to a developing unit connected in line or to a predetermined transfer device.

11. The apparatus according to claim 9, wherein said job switching means and said original plate switching means perform the switching operation in accordance with an instruction from a console of the exposure apparatus or an external controller connected to the exposure apparatus.

12. A semiconductor manufacturing apparatus comprising the exposure apparatus defined in claim 9 as exposure means.

13. A semiconductor manufacturing method of controlling an exposure mechanism using a controller to perform exposure processing for a plurality of substrates in accordance with a plurality of jobs, including a first job and a second job to be performed subsequent to the first job, each of the jobs having predetermined operations and exposure parameters necessary for the exposure processing set in advance, and manufacturing semiconductor devices from the exposed substrates, said method comprising the step of:

switching, by the controller, from the first job to the second job during or after a period of exposure of a final shot of a final substrate of the plurality of substrates, to be exposed in accordance with the first job, and before the exposed final substrate is unloaded from a position at which the final substrate is exposed.

14. The method according to claim 13, wherein the substrate is unloaded to a developing unit connected in line or to a predetermined transfer device.

15. The method according to claim 13, wherein the step of switching is performed in accordance with an instruction from a console of the exposure mechanism or an external integral controller connected to the exposure mechanism.

16. The method according to claim 13, wherein the step of switching from the first job to the second job, corresponding to the lot to be processed next, comprises loading the second job from the controller to the exposure mechanism.

17. A semiconductor manufacturing method of controlling an exposure mechanism using a controller to perform exposure processing for a plurality of substrates using original plates, which include a first original plate and a second original plate to be used next to the first original plate, each of the original plates having a pattern to be used for exposing the plurality of substrates, and manufacturing semiconductor devices from the exposed substrates, said method comprising the step of:

switching, by the controller, from the first original to the second original plate during or after a period of exposure of a final shot of a final substrate of the plurality of substrates, to be exposed by using the first original plate, and before the exposed final substrate is unloaded from a position at which the final substrate is exposed.

18. The method according to claim 17, wherein the substrate is unloaded to a developing unit connected in line or to a predetermined transfer device.

19. The method according to claim 17, wherein the step of switching is performed in accordance with an instruction from a console of the exposure mechanism or an external integral controller connected to the exposure mechanism.

20. The method according to claim 17, wherein the step of switching from the first original plage to the second original plate, corresponding to the lot to be processed next, comprises loading the original plate from the controller to the exposure mechanism.

21. A semiconductor manufacturing method of controlling an exposure mechanism using a controller to perform exposure processing for a plurality of substrates in accordance with a plurality of jobs, including a first job and a second job to be performed subsequent to the first job, each of the jobs having predetermined operations and exposure parameters necessary for the exposure processing set in advance, using original plates, which include a first original plate and a second original plate to be used next to the first original plate, each of the original plates having a pattern to be used for exposing the plurality of substrates, and manufacturing semiconductor devices from the exposed substrates, said method comprising the step of:

switching, by the controller, from the first job to the second job and switching from the first original plate to the second original plate during or after a period of exposure of a final shot of a final substrate of the plurality of substrates, to be exposed in accordance with the first job by using the original plate, and before the exposed final substrate is unloaded from a position at which the final substrate is exposed.

22. The method according to claim 21, wherein the substrate is unloaded to a developing unit connected in line or to a predetermined transfer device.

23. The method according to claim 21, wherein the step of switching is performed in accordance with an instruction from a console of the exposure mechanism or an external integral controller connected to the exposure mechanism.

24. The method according to claim 21, wherein the step of switching from the first job and the first original plate to the second job and the second original plate, corresponding to the lot to be processed next, comprises loading the second job and the second original plate from the controller to the exposure mechanism.

25. A computer-readable storage medium which stores a control program of an exposure apparatus for performing exposure processing for a plurality of substrates in accordance with a plurality of jobs, including a first job and a second job to be performed subsequent to the first job, each of the jobs having predetermined operations and exposure parameters necessary for the exposure processing set in advance, wherein the storage medium is executed in the exposure apparatus to operate as switching means for switching from the first job to the second job during or after a period of exposure of a final shot of a final substrate of the plurality of substrates, to be exposed in accordance with the first job, and before the exposed final substrate is unloaded from a position at which the final substrate is exposed.

26. A computer-readable storage medium which stores a control program of an exposure apparatus for performing exposure processing for a plurality of substrates using a plurality of original plates, including a first original plate and a second original plate to be used next to the first original plate, each of the original plates having a pattern to be used for exposing the plurality of substrates, wherein the storage medium is executed in the exposure apparatus to operate as switching means for switching from the first original plate to the second original plage during or after a period of exposure of a final shot of a final substrate of the plurality of substrates, to be exposed by using the first original plate, and before the exposed final substrate is unloaded from a position at which the final substrate is exposed.

27. A computer-readable storage medium which stores a control program of an exposure apparatus for performing exposure processing for a plurality of substrates in accordance with a plurality of jobs, including a first job and a second job to be performed subsequent to the first job, each of the jobs having predetermined operations and exposure parameters necessary for the exposure processing set in advance, using original plates, which include a first original plate and a second original plate to be used next to the first original plate, each of the original plates having a pattern to be used for exposing the plurality of substrates, wherein the storage medium is executed in the exposure apparatus to operate as:

job switching means for switching from the first job to the second job during or after a period of exposure of a final shot of a final substrate of the plurality of substrates, to be exposed in accordance with the first job, and before the exposed final substrate is unloaded from a position at which the final substrate is exposed, and original plate switching means for switching from the first original plate to the second original plate during or after a period of exposure of a final shot of the final substrate to be exposed, by using the first original plate, and before the exposed final substrate is unloaded from the position at which the final substrate is exposed.

* * * * *

UNITED STATES PATENT AND TRADEMARK OFFICE
CERTIFICATE OF CORRECTION

PATENT NO.    : 6,445,441 B1
DATED         : September 3, 2002
INVENTOR(S)   : Takashi Mouri It is certified that error appears in the above-identified patent and that said Letters Patent is hereby corrected as shown below:

Column 1,
Line 35, "manufacturing," should read -- manufacturing --.

Column 9,
Line 15, "plage" should read -- plate --.

Column 10,
Line 22, ""plage" should read -- plate --.

Signed and Sealed this

Eleventh Day of February, 2003

JAMES E. ROGAN
*Director of the United States Patent and Trademark Office*